United States Patent [19]

Demark et al.

[11] 4,416,156
[45] Nov. 22, 1983

[54] HIGH PRESSURE ELECTRICAL FEEDTHRU

[75] Inventors: Anthony M. Demark, Plymouth Meeting; William K. Erhardt, Richboro, both of Pa.

[73] Assignee: Honeywell Inc., Minneapolis, Minn.

[21] Appl. No.: 333,842

[22] Filed: Dec. 23, 1981

[51] Int. Cl.³ .............................................. G01L 9/06
[52] U.S. Cl. ...................................... 73/727; 73/756; 338/4
[58] Field of Search ................ 73/727, 726, 721, 720, 73/DIG. 4, 756; 338/4; 310/338, 324

[56] References Cited

U.S. PATENT DOCUMENTS

| | | | |
|---|---|---|---|
| 3,918,019 | 11/1975 | Nunn | 73/726 |
| 3,968,466 | 7/1976 | Nakamura et al. | 73/727 |
| 4,023,562 | 5/1977 | Hynecek | 73/727 |
| 4,240,002 | 12/1980 | Tosi | 310/324 |

Primary Examiner—Donald O. Woodiel
Attorney, Agent, or Firm—Mitchell J. Halista; Trevor B. Joike

[57] ABSTRACT

A high pressure electrical feedthru uses a ceramic circuit assembly which has a metalized bonding area on the surface of the ceramic to enable the ceramic assembly to be brazed to an outer support housing. The ceramic structure has embedded therein electrical conductors which extend from electrical connection terminals at one end of the feedthru to electrical connection terminals at the other end of the feedthru with the brazing area being located therebetween. The ceramic structure is arranged to support a pressure sensor which is connected to the electrical connection terminals at one end of the ceramic structure. The sensor and the adjacent end of the feedthru are located in a high pressure environment within a pressure tight housing. The ceramic assembly is brazed to the interior surface of the housing in the area of the metalized bonding surface while allowing the other end of the ceramic feedthru to extend out of the housing to provide electrical connection terminals outside of the high pressure environment for connection of the sensor to associated apparatus.

10 Claims, 4 Drawing Figures

U.S. Patent  Nov. 22, 1983  4,416,156
F I G. 1
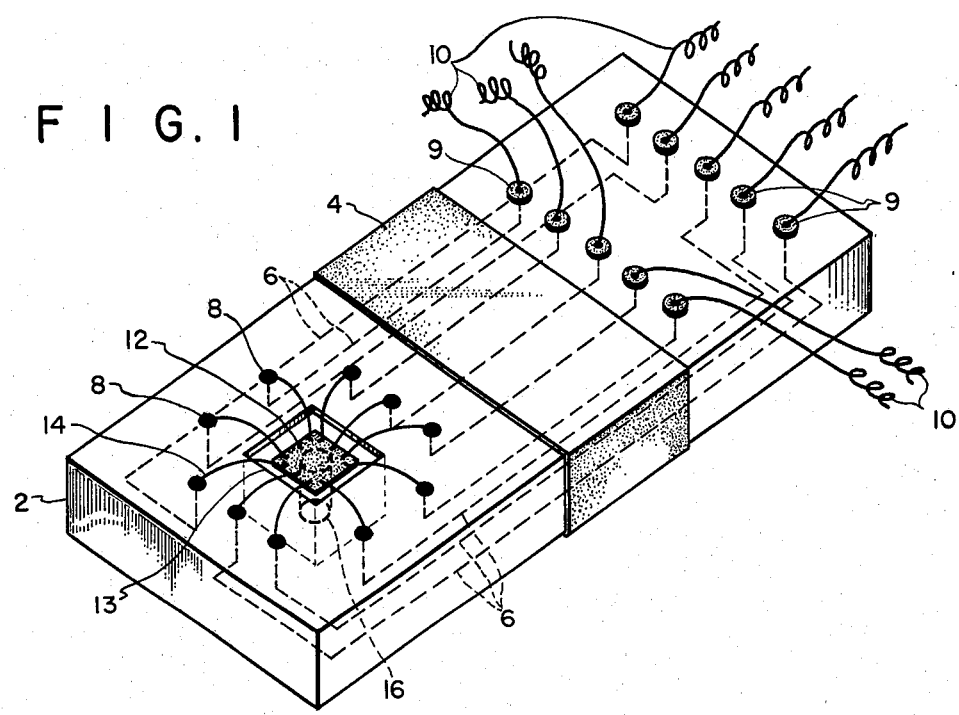
F I G. 2
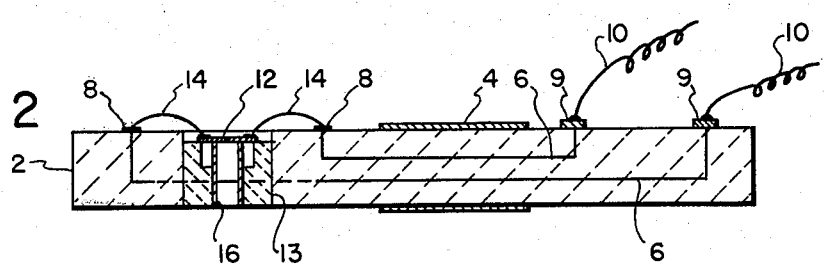
F I G. 3
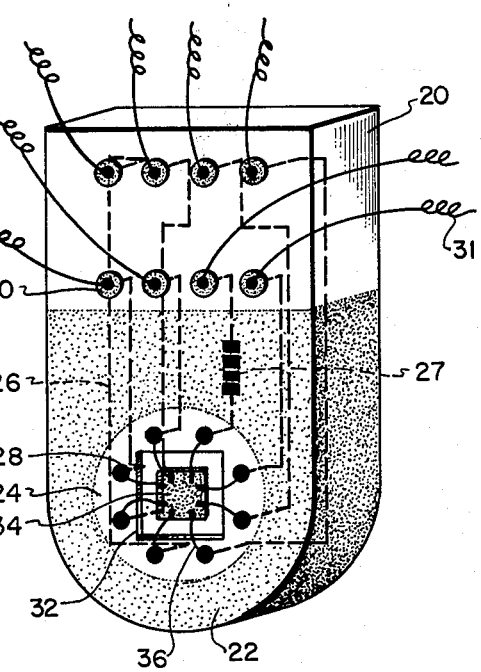
F I G. 4
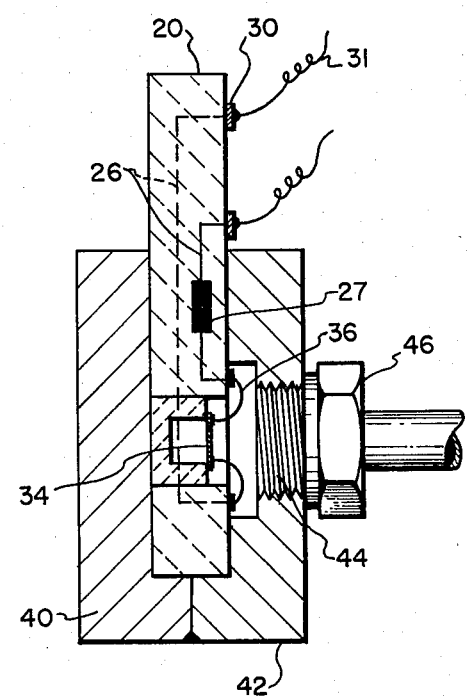

HIGH PRESSURE ELECTRICAL FEEDTHRU

BACKGROUND OF THE INVENTION

1. Field of the Invention

The present invention relates to electrical feedthru devices. More specifically, the present invention is directed to an electrical feedthru device for providing electrical innerconnections between the high and low pressure environments.

2. Description of the Prior Art

The conventional electrical feedthru devices for providing electrical innerconnections while maintaining a fluid tight encapsulating structure such as that shown in U.S. Pat. Nos. 2,761,891 and 3,132,322 used metal headers containing glass or ceramic insulators surrounding metal signal conductors. Such devices involve manufacturing expenses, sensor mounting problems and unreliable connections to the sensors in the high pressure environment and to circuits in the low pressure side of the header. Thus, such feedthru devices produced inherent problems in manufacturing pressure transmitters using electrically operated sensors which required the passage of electrical signals from the high pressure side of the header to the signal utilization environment which conventionally was in a low pressure side of the feedthru. Accordingly, it would be desirable to provide a feedthru that would seal the high pressure environment from communication with the low pressure environment while providing electrical innerconnections therebetween and being suitable for supporting electrical sensors and related circuitry elements.

SUMMARY OF THE INVENTION

An object of the present invention is to provide an improved electrical feedthru capable of fluid tight electrical innerconnections between high and low pressure environments while supporting sensors and circuiit elements.

In accomplishing this and other objects, there has been provided, in accordance with the present invention an electrical feedthru utilizing a ceramic circuit assembly having a layered structure including electrical conductors and circuit elements within the ceramic structure innerconnecting electrical connectors mounted on opposite ends of the ceramic structure. A sensor is mounted at one end of the ceramic structure and attached to the electrical connectors at that end of the structure. A portion of the ceramic structure between the electrical connectors at opposite ends thereon is provided with an encircling area coated with a material suitable for providing a fluid tight seal to a housing enclosing the high pressure environment to provide a fluid tight seal around the ceramic assembly.

BRIEF DESCRIPTION OF THE DRAWINGS

A better understanding of the present invention may be had when the following detailed description is read in connection with the accompanying drawings, in which:

FIG. 1 is a pictorial illustration of an electrical feedthru embodying an example of the present invention, FIG. 2 is a cross-sectional illustration of the feedthru shown in FIG. 1, FIG. 3 is a pictorial illustration of a second embodiment of the present invention and FIG. 4 is a cross-sectional illustration of a pressure sensor in a pressure transmitter utilizing an example of the feedthru of the present invention.

DESCRIPTION OF THE PREFERRED EMBODIMENT

Referring to FIG. 1 in more detail, there is shown an electrical feedthru utilizing a ceramic circuit assembly incorporating a layered structure in the form of an elongated ceramic bar 2. An intermediate surface area 4 on the surface of the ceramic bar 2 is coated with a material, e.g., moly-manganese, Kovar, nickel, etc., suitable for attaching the ceramic bar 2 to a high pressure housing by any suitable technique to provide a fluid tight seal, e.g., by brazing. A plurality of electrical conductors 6 are embedded within the ceramic layered structure and extend between respective ones of a plurality of electrical connectors 8 located at a first end of the ceramic bar 2 and respective ones of a plurality of electrical connectors 9 located at the other or second end of the ceramic bar 2. The ceramic bar 2 provides a fluid tight seal along the surface of the conductors 6 to maintain a fluid tight integrity between the ends of the bar 2. Electrical conductors 10 are connected to the electrical connectors 9 to provide external electrical connections to the embedded electrical conductors 6.

A sensor element 12 is located within an aperture 13 in the first end of the bar 2 adjacent to the electrical connectors 8. Electrical conductors 14 are arranged to connect the sensor 12 to the electrical connectors 8. A support assembly 16 is provided in the aperture 13 for supporting the sensor 12. The sensor 12 may be any suitable pressure responsive element having a pattern of strain sensitive elements thereon which respond to differential pressure on the substrate supporting the pressure sensitive elements to produce variations in electrical output signals obtained from the strain sensitive elements, such devices being well-known in the art, e.g., the pressure responsive apparatus shown in U.S. Pat. No. 3,780,588.

In FIG. 2, there is shown a cross-sectional illustration of the feedthru shown in FIG. 1 using similar reference numbers. The support assembly 16 is arranged to provide an internal reference pressure against which the high pressure environment of the sensor 12 acts to induce a strain into the sensor 12. Thus, the support assembly 16 is connected with a fluid tight connection to the sensor substrate 12 at one end of the assembly 16 while the other end of the assembly 16 is connected to a housing (not shown) surrounding the high pressure environment into which the feedthru of the present invention is admitted.

The feedthru of the present invention is fabricated by first forming the innerconnecting conductors 6 using conventional techniques onto a longitudinal surface of a half of a ceramic sandwich forming the ceramic bar 2. The other half of the ceramic sandwich would then be heremetically bonded to the first to seal the innerconnecting conductors 6 within the bar 2. The bonding area 4 is subsequently applied to an encircling surface area of the ceramic feedthru assembly 2 to form a collar for bonding the ceramic feedthru to a pressure housing to provide a fluid tight seal therebetween. The plurality of surface connectors or pads 8 and 9 are also applied to the surface of respective ends of the ceramic bar 2 and electrically connected to the corresponding ends of the electrical conductors 6 projecting therefrom. A suitable technique for providing the multi-layer ceramic sandwich with the embedded conductors 6 connectors 8 and 9 is Kyocera Packaging utilizing an alumina powder and sold by Kyocera Inc. of San Diego, Calif.

In FIG. 3, there is shown an alternate embodiment of the present invention utilizing a multi-layer ceramic slab 20 having a metalized coating 22 on one end thereof with the exception of an area 24 located within the area coated by the coating 22. A plurality of electrical conductors 26 are embedded within the slab 20 to provide electrical connections between electrical connectors 28 mounted on the surface of the slab 20 within the area 24 and electrical connectors 30 mounted on the slab 20 outside of the area 22. Electrical connectors 31 are provided for connecting the electrical connectors 30 to associated equipment. An aperture 32 within the slab 20 in the area 24 is arranged to contain a sensor 34. A plurality of electrical conductors 36 are provided to connect the sensor 34 to the electrical connectors 28. As previously described for the feedthru shown in FIGS. 1 and 2, the frequency assembly shown in FIG. 3 provides a support for the sensor 34 while maintaining a fluid-tight isolation of the sensor 34 by the connection of the coating 22 to a surrounding housing and the fluid-tight seal provided by the ceramic sandwich along the end of the conductors 26.

In FIG. 4, there is shown a pressure transmitter utilizing the feedthru of the present invention as specifically shown in FIG. 3. Similar reference numbers have been used in FIG. 4 to denote the structural elements shown in FIG. 3. The transmitter shown in FIG. 4 includes a housing having a pair of housing layers 40 and 42 surrounding the end of the slab 20 containing the sensor 34. The housing halves 40 and 42 are connected to the coating 22 by any suitable technique, e.g., by brazing, while the halves 40 and 42 may be additionally connected to each other by conventional methods. A fluid port 44 is provided within one of the transmitter housing halves, e.g., the second half 42. A fluid tubing connector 46 is used to connect a fluid pipeline to the fluid port 44 for applying a fluid pressure to the sensor 34. The pressure applied to the sensor may of course be either above or below the environmental pressure surrounding housing which in combination with the electrical feedthru of the present invention isolatess the interior of the transmitter from the surrounding environment.

Accordingly, it may be seen, that there has been provided, in accordance with the present invention, a high pressure electrical feedthru for providing a fluid tight seal while affording electrical interconnections and a support for a sensor.

The embodiments of the invention in which an exclusive property or privilege is claimed are defined as follows:

1. An electrical feedthru comprising
   a plurality of electrical conductors,
   an electrically insulating ceramic structure extending longitudinally along said conductors and being in fluid-tight relationship therewith,
   a first plurality of electrical connectors mounted on a first end of said ceramic structure with each of said connectors being connected to a respective one of said electrical conductors at one end of said electrical conductors,
   a second plurality of electrical connectors mounted on a second end of said ceramic structure with each of said second connectors being connected to respective ones of the other ends of said electrical conductors,
   a surface area encircling said ceramic structure intermediate said first and second plurality of electrical connectors to provide a surface for connection to a surrounding housing as a fluid-tight seal therebetween,
   an aperture in one end of said ceramic structure adjacent to a first one of said plurality of electrical connectors,
   a sensor mounted within said aperture and
   a plurality of electrical connectors connecting said sensor to said first plurality of electrical connectors.

2. An electrical feedthru as set forth in claim 1 wherein said surface area includes a metallized layer of a material selected from the group consisting of molymanganese and nickel.

3. An electrical feedthru as set forth in claim 1 wherein said surface area is a band encircling said ceramic structure.

4. An electrical feedthru as set forth in claim 1 wherein said surface area covers an end of said ceramic surface while omitting an encircled area for mounting said second electrical connectors.

5. An electrical feedthru comprising
   a plurality of electrical conductors,
   an electrically insulating ceramic structure extending longitudinally along said conductors and being in fluid-tight relationship therewith,
   a first plurality of electrical connectors mounted on a first end of said ceramic structure with each of said connectors being connected to a respective one of said electrical conductors at one end of said electrical conductors,
   a second plurality of electrical connectors mounted on a second end of said ceramic structure with each of said second connectors being connected to respective ones of the other ends of said electrical conductors,
   a surface area encircling said ceramic structure intermediate said first and second plurality of electrical connectors to provide a surface for connection to a surrounding housing as a fluid-tight seal therebetween,
   a sensor mounted on said first end of said ceramic structure and free of contact with said surface area and
   a plurality of electrical connectors connecting said sensor to said first electrical connectors.

6. An electrical feedthru as set forth in claim 5 wherein said surface area includes a metallized layer of a material selected from the group consisting of molymanganese and nickel.

7. An electrical feedthru as set forth in claim 5 wherein said surface area is a band encircling said ceramic structure.

8. An electrical feedthru as set forth in claim 5 wherein said surface area covers an end of said ceramic surface while omitting an encircled area for mounting said second electrical connectors.

9. A transmitter comprising
   a housing separating an internal environment from an external environment,
   pressure admitting means for supplying a fluid to be measured to the internal environment of said housing, a sensor located in said housing and responsive to said fluid, a plurality of electrical conductors, a ceramic structure extending longitudinally along said conductors and being in fluid-tight relationship therewith, said structure also extending through said housing from said internal environment to said external environment, a first plurality of electrical connectors mounted on a first end of said ceramic structure exposed to said internal environment with each of said connectors being connected to a respective one of said electrical conductors at one end of electrical conductors, a second plurality of electrical connectors mounted on a second end of said ceramic structure exposed to said external environment with each of said second connectors being connected to respective ones of the other ends of said electrical conductors, a surface area encircling said ceramic structure intermediate said first and second plurality of connectors and in contact with said housing to form a fluid-tight seal therewith, sensor mounting means for mounting said sensor on said first end of said ceramic structure free of said surface area and a plurality of electrical connectors connecting said sensor to said first plurality of electrical connectors.

10. A transmitter as set forth in claim 9 wherein said surface area includes a metallized layer of a material selected from the group consisting of moly-manganese and nickel.

* * * * *